United States Patent [19]
Itoh et al.

[11] Patent Number: 5,993,081
[45] Date of Patent: Nov. 30, 1999

[54] IN-LINE PROCESSING SYSTEM

[75] Inventors: Hiroyuki Itoh; Shinji Tsutsui; Masahide Sato, all of Utsunomiya, Japan

[73] Assignee: Canon Kabushiki Kaisha, Tokyo, Japan

[21] Appl. No.: 08/732,718

[22] Filed: Oct. 18, 1996

[30]  Foreign Application Priority Data

Oct. 24, 1995 [JP] Japan ................................ 7-275557
Apr. 8, 1996 [JP] Japan ................................ 8-110601
Sep. 30, 1996 [JP] Japan ................................ 8-258741

[51] Int. Cl.⁶ ........................... G03D 5/00; B65G 25/00
[52] U.S. Cl. ........................ 396/611; 414/416; 414/937; 414/938
[58] Field of Search ........................... 396/610, 611, 396/612, 624, 627, 628, 630; 414/416, 217, 225, 935, 937, 938, 940; 355/27

[56]  References Cited

U.S. PATENT DOCUMENTS

| | | |
|---|---|---|
| 4,611,967 | 9/1986 | Tsutsui .................................. 414/411 |
| 4,747,608 | 5/1988 | Sato et al. ............................. 279/1 |
| 4,924,258 | 5/1990 | Tsutsui .................................. 355/53 |
| 5,442,416 | 8/1995 | Tateyama et al. ..................... 396/611 |
| 5,556,248 | 9/1996 | Grunes .................................. 414/416 |
| 5,651,823 | 7/1997 | Parodi et al. ......................... 396/624 |
| 5,826,129 | 10/1998 | Hasebe et al. ....................... 396/611 |

FOREIGN PATENT DOCUMENTS 322205  6/1989  European Pat. Off. .
2-2605  1/1990  Japan .

*Primary Examiner*—Alan A. Mathews
*Attorney, Agent, or Firm*—Fitzpatrick, Cella, Harper & Scinto

[57]  ABSTRACT

An in-line processing system having an exposure processing unit and a coating and development processing unit is provided with a conveyance arm for transferring a workpiece between these units. The conveyance arm can access to each of these units, and these units have horizontal workpiece holding planes of substantially the same level. The workpiece can be conveyed between these units while being kept laid horizontally.

6 Claims, 11 Drawing Sheets

FIG. I

IN-LINE PROCESSING SYSTEM

FIELD OF THE INVENTION AND RELATED ART

This invention relates to an in-line processing system wherein two or more processing apparatuses for processing a workpiece sequentially are disposed in line, such as, for example, a system having a combination of an exposure apparatus and a coating and development apparatus, for manufacture of devices such as semiconductor devices or liquid crystal panels, for example.

In a production line for manufacture of semiconductor or liquid crystal devices, various processing apparatuses are disposed in an order of the processes. For higher production efficiency, use of an automated system, called "in-line processing system", wherein a substrate (workpiece) moves automatically through processes such as a resist coating process, an exposure process and a development process, has been increased. An example of such in-line processing system is disclosed in Japanese Laid-Open Patent Application, Laid-Open No. 2605/1990.

In the field of semiconductor or liquid crystal device production, the size of a substrate is being increased more and more. This is particularly notable in the field of liquid crystal panel manufacture and, in the past few years, the size of glass substrate to be handled has been enlarged three times or more in terms of area ratio. The enlargement of the size of substrate necessarily requires enlargement of various processing apparatuses, and it results in an increase of the area for placement of them. Since such processing apparatuses are usually placed in a clean room, this causes increased construction cost or running cost of the clean room and, then, increased cost for device manufacture.

Further, for enhancement of device production efficiency, the time for processing one workpiece (called "tact time") should be constant for different processes or, alternatively, the processing time at a downstream process should be shorter than that at an upstream process (for example, the exposure process time and the development process time should be shorter than the coating process time, or the development process time should be shorter than the exposure process time). If the tact time at a downstream process is longer, the flow of workpieces becomes stagnant and the rate of operation of the processing line may slow down. If the operation of on processing apparatus stops accidentally, it influences the flow in the whole line. This may cause decreased rate of operation of the line and increased cost of device manufacture.

SUMMARY OF THE INVENTION

It is accordingly a primary object of the present invention to provide an in-line processing system for performing plural processes sequentially having an increased processing efficiency or an improved space efficiency, thus enabling lower-cost device manufacture.

It is another object of the present invention to provide a system that can meet enlargement of size of a workpiece.

It is a further object of the present invention to provide a system wherein any accident in operation of an apparatus in the line can be met flexibly such that a high processing efficiency of the in-line processing can be kept.

It is a yet further object of the present invention to provide an in-line processing system which is easy in maintenance or handling.

In accordance with an aspect of the present invention, there is provided an in-line processing system, comprising: a first processing unit for performing an exposure process to a workpiece; a second processing unit for performing a second process, different from the exposure process, to the workpiece; and a conveying arm mechanism for conveying the workpiece between said first and second processing units and being accessible to each of said first and second processing units; wherein said first and second processing units have horizontal workpiece holding planes of substantially the same level, and wherein said conveying mechanism conveys the workpiece between said first and second processing units while keeping the workpiece horizontal.

In accordance with another aspect of the present invention, there is provided an in-line processing system usable with plural workpieces, comprising: a first processing unit for performing an exposure process to a workpiece; a second processing unit for performing a second process, different from the exposure process, to the workpiece; a conveying arm mechanism for conveying the workpiece between said first and second processing units and being accessible to each of said first and second processing units; and a storing mechanism for temporarily accommodating workpieces being conveyed.

In accordance with a further aspect of the present invention, there is provided an in-line processing system usable with plural workpieces, comprising: a first processing unit for performing an exposure process to a workpiece; a second processing unit for performing a second process, different from the exposure process, to the workpiece; and a conveying arm mechanism for conveying the workpiece between said first and second processing units; and a through cassette for temporarily accommodating workpieces being conveyed, wherein a workpiece can be put into and off said cassette through the front and the back of said cassette.

In accordance with a yet further aspect of the present invention, there is provided an in-line processing system, comprising: a first line; and a second line; wherein each of said first and second lines has a first processing unit having an exposure apparatus, for performing an exposure process to a workpiece, and a second processing unit connected to said first processing unit and for performing a second process, different from the exposure process, to the workpiece; and wherein said first and second lines are arranged so that front faces of the exposure apparatuses of said first processing units of said first and second lines are opposed to each other, and so that a work space for an operator is defined between the opposed exposure apparatuses.

In one preferred form according to any of these aspects of the present invention, said second processing system may includes at least one of a resist coating apparatus and a developing apparatus.

In another preferred form according to any of these aspects of the present invention, both of said first and second units may be disposed in a clean room.

In accordance with a still further aspect of the present invention, there is provided an in-line processing system usable with plural workpieces, comprising: a first processing unit for performing a first process to a workpiece; a second processing unit for performing a second process, different from the first process, to the workpiece; and a storing mechanism provided in a portion of a conveyance path between said first and second processing units, for accommodating workpieces therein.

In one preferred form of this aspect of the present invention, said storing mechanism may have a through cassette, and wherein a workpiece can be put into and off said cassette through the front and the back of said cassette.

In accordance with a still further aspect of the present invention, there is provided a method of manufacturing a device by using any of the in-line processing systems such as described above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Embodiment 1

An in-line processing system of a first embodiment can be used as a production line in a device manufacturing factory. Here, description will be made on an example wherein a workpiece is a glass substrate for liquid crystal panel. However, it may be a semiconductor substrate for integrated circuit.

Figure 1:
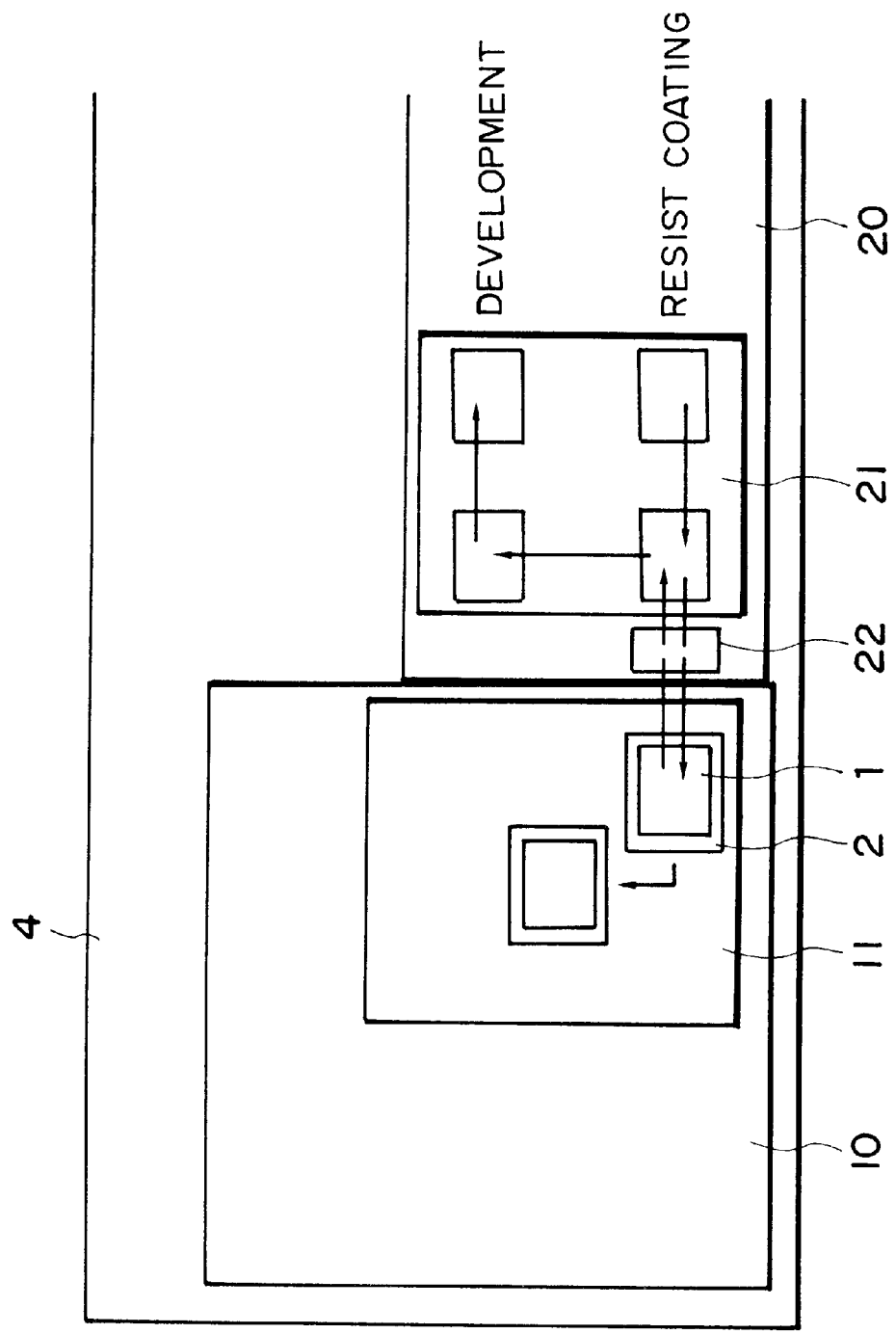
FIG. 1 is a schematic view of general structure of an in-line processing system according to a first embodiment of the present invention.
Figure 2:
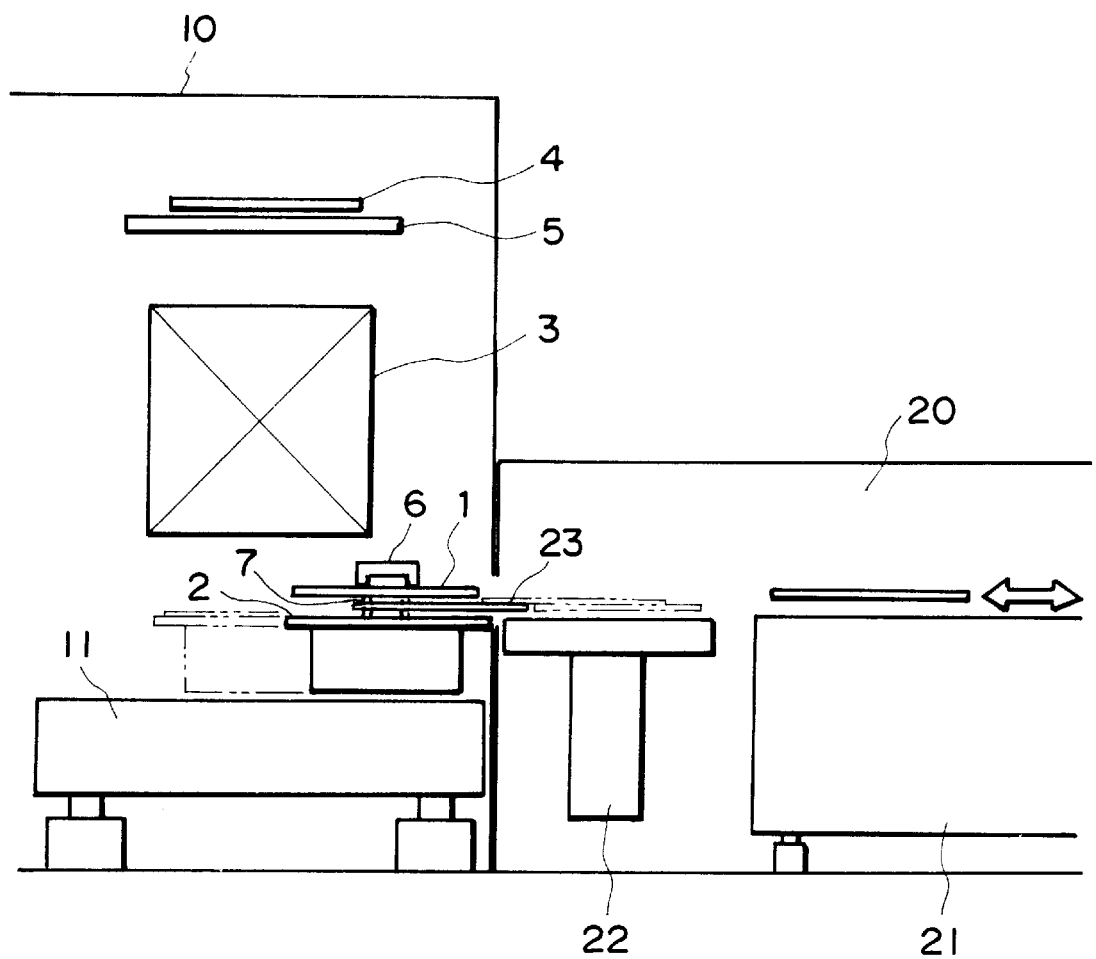
FIG. 2 is a fragmentary side view of a portion of the processing system of FIG. 1.
Figure 3:
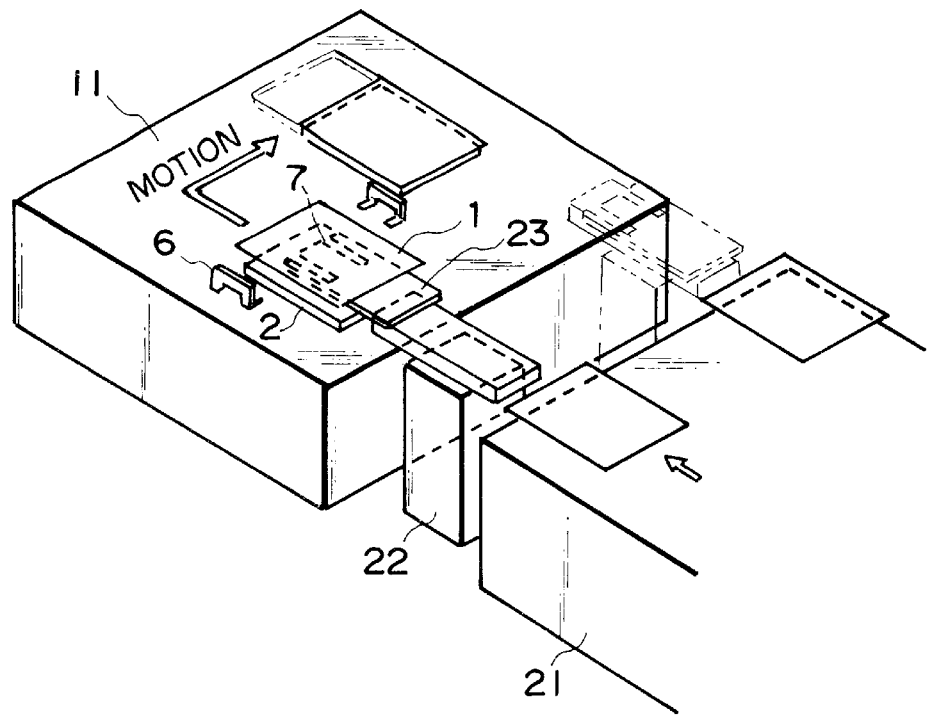
FIG. 3 is a perspective view for explaining transfer of a substrate to an exposure apparatus.
Figure 4:
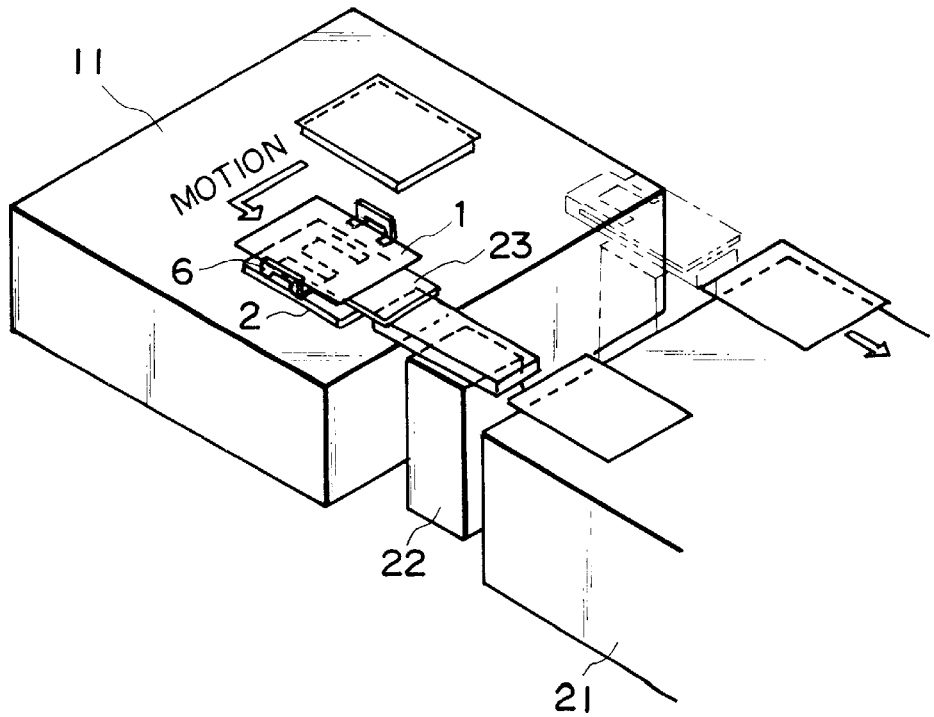
FIG. 4 is a perspective view for explaining collection of a substrate from an exposure apparatus.

FIG. 1 is a schematic view for explaining general structure and operation procedure, and FIG. 2 shows details of connections of units. FIG. 3 is a perspective view for explaining how a workpiece is received by an exposure apparatus, and FIG. 4 is a perspective view for explaining how a workpiece is unloaded from the exposure apparatus.

General structure and flow of workpiece will first be described with reference to FIG. 1. Denoted at 10 is an exposure processing unit which includes a major assembly of exposure apparatus 11. Denoted at 20 is is a coating and development processing unit which includes a coating apparatus and a developing apparatus 21. These units are disposed in a clean room 4. Disposed between the exposure processing unit 10 and the coating and development unit 21 is a conveying system 22 having a conveyance arm for transfer of a workpiece between them.

In the structure described above, a workpiece 1 having a resist applied thereto by the coating and development processing unit 20 is conveyed by the substrate conveying system 22 and is placed on an exposure stage 2 of the exposure processing unit 10. Thereafter, the exposure stage 2 moves to a position below a projection optical system 3 (not shown in FIG. 1). After an autofocusing operation and a fine alignment operation, an exposure process is performed. After the exposure process, the workpiece 1 is moved by the exposure stage 2 to a substrate transfer position of the substrate conveying system 22 where the workpiece 1 is collected by the substrate conveying system 22. Then, the workpiece 1 flows to a development process.

Referring to FIG. 2, the connection between the exposure processing unit and the coating and development processing unit will be explained in detail. Disposed within the exposure processing unit 10 are a mask stage 5, above the projection optical system 3, for carrying thereon a mask 4, and an exposure stage 2, below the projection optical system 3, for carrying thereon a workpiece 1 and being movable in X, Y and θ directions. The exposure stage 2 is mounted on the exposure apparatus major assembly 11. A workpiece as has been moved on to the exposure stage 2 is brought into alignment with the mask 4 through the projection optical system 3. After this, the mask stage 5 and the exposure stage 2 are moved in a timed relation with each other, for scanning exposure, by which a pattern of the mask is transferred (printed) on to the workpiece. The coating and development processing unit 20 has a processing apparatus 21 disposed therein for performing a resist coating operation and a developing operation. Also, the substrate conveying system 22 having a conveyance arm 23 is disposed within the coating and development processing unit 20. The workpiece holding plane of the coating and development processing unit 21 and the workpiece holding plane of the exposure stage 2 are positioned substantially at the same level, in vertical direction and from the floor. Also, the workpiece can be conveyed between them while being laid horizontally. This arrangement eliminates the necessity of vertical motion or rotational motion, such that the mechanism of the conveyance arm 23 can be simple.

Transfer of a workpiece will now be explained in greater detail. FIG. 3 illustrates how a workpiece 1 having a resist coating is transferred to the exposure apparatus. As the workpiece 1 being conveyed by the conveyance arm 23 moves into the exposure apparatus while being kept in its horizontal attitude, the exposure stage 2 has been in a stand-by state at the substrate transfer position and plural workpiece receiving pins 7 (lift pins) are being protruded above from the exposure stage 2. Under such condition, the workpiece 1 is moved down by the conveyance arm 23 and placed on the lift pins 7, and it is held by vacuum attraction. Thereafter, the conveyance arm 23 moves back to the coating and development apparatus, while leaving the workpiece 1 on the stage. Simultaneously as the lift pins 7 move down, a workpiece end face position measuring apparatus (not shown) operates to measure the position of the workpiece 1. Then, the exposure stage 2 moves to the exposure position while a rough alignment operation to the workpiece 1 is performed on the basis of the result of that measurement. After an autofocusing operation and a fine alignment operation through the projection optical system, the exposure process is performed.

Referring now to FIG. 4, collection of a workpiece 1 after the exposure process will be explained. After completion of exposure process, the exposure stage 2 moves to a substrate transfer position. At this position, the workpiece 1 is lifted up by a substrate collection arm 6 provided within the exposure apparatus. After this, the conveyance arm 23 moves to and below the bottom of the workpiece 1, and attracts the workpiece thereto. Then, the workpiece is conveyed out of the exposure apparatus and to the coating and development unit, while being kept laid horizontally. The workpiece thus collected back to the coating and development processing unit 20 then flows to the subsequent development process.

Although in this embodiment the conveyance arm is provided within the coating and development processing unit, it may be provided in the exposure processing unit. An alternative structure may be that neither the exposure processing unit nor the coating and development processing unit has a conveyance arm, but a conveyance arm which can access to each of the exposure processing unit and the coating and development processing unit is provided between these units.

The concept described above is applicable not only to the connection between an exposure apparatus and a coating and development apparatus as described but also to an in-line processing system having successive processes such as a combination of a development apparatus and an etching apparatus, a combination of an etching apparatus and an usher, or a combination of an usher and a film forming apparatus, for example.

With the structure of an in-line processing system such as described above, the conveying system can be simple and the overall area for placement can be smaller by an amount corresponding to reduction in space required for the conveying system. There may be an additional advantage of a decrease in the rate of breakdown of the whole substrate conveyance line.

Embodiment 2

An in-line processing system according to a second embodiment can be used as a production line in a device manufacturing factory. Here, description will be made on an example wherein a workpiece is a glass substrate for liquid crystal panel. However, it may be a semiconductor substrate for integrated circuit.

Figure 5:
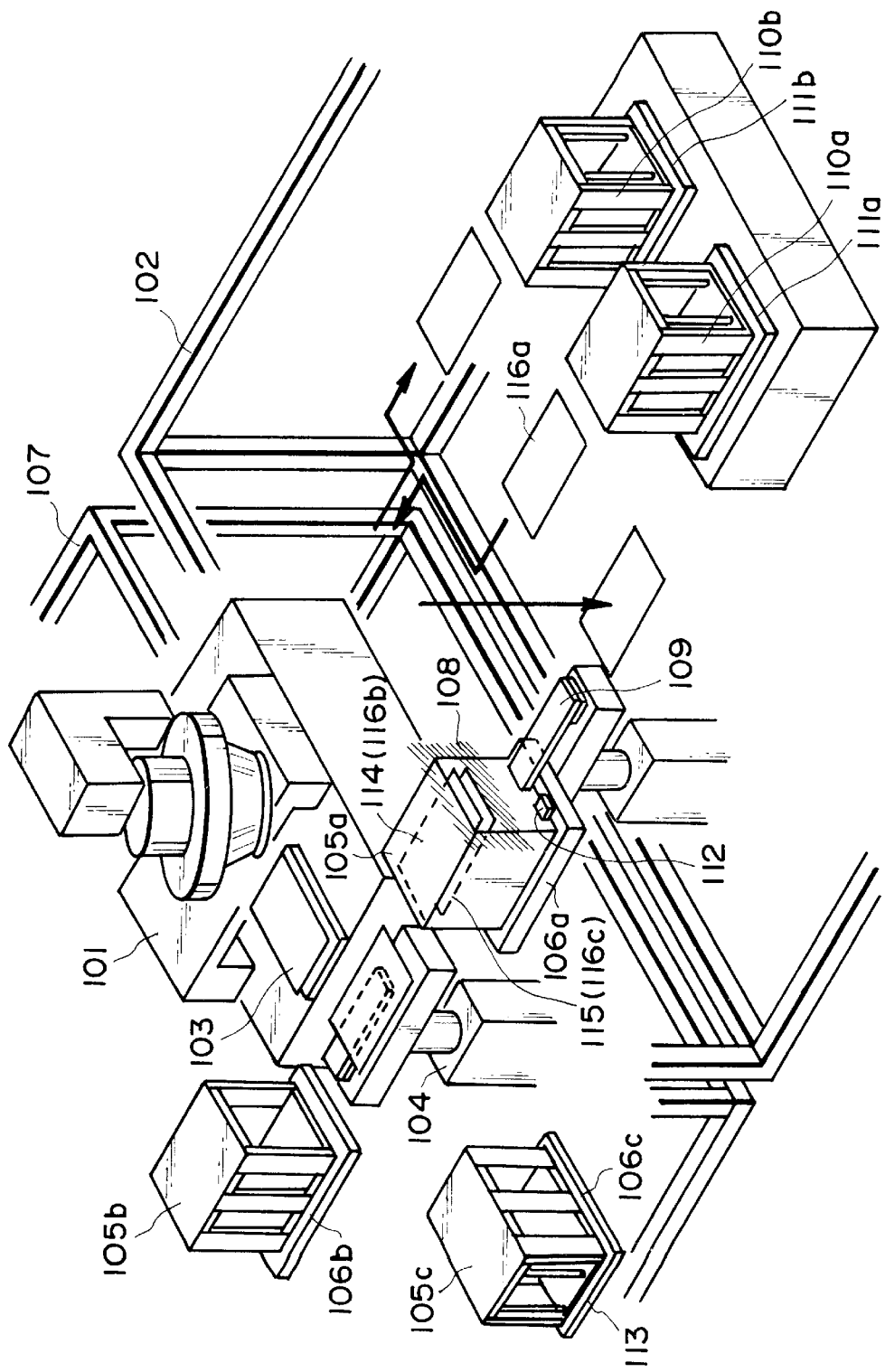
FIG. 5 is a schematic view of general structure of an in-line processing system according to a second embodiment of the present invention.

In FIG. 5, denoted at 101 is an exposure apparatus, and denoted at 102 is a coating and development processing unit which includes a coating and development apparatus for performing a pre-process (resist coating) and a post-process (development) for the exposure apparatus. Denoted at 103 is an exposure stage provided within the exposure apparatus 101, for holding and moving a workpiece. Denoted at 104 is a conveying system provided within the exposure apparatus, for supplying a workpiece to the exposure stage 103 and for collecting the same from the exposure stage. Denoted at 105 (105a, 105b and 105c) are cassettes placed in the vicinity of the conveying system 104, each being able to accommodate therein a plurality of workpieces. Denoted at 106 (106a, 106b and 106c) are cassette tables on which corresponding cassettes are placed. Denoted at 107 is an exposure processing unit for controlling the temperature, humidity and cleanness of the exposure apparatus 101 and maintaining them constant. Denoted at 108 is an opening formed in a side wall of the exposure processing unit 107 for workpiece transfer. A similar opening is formed in the coating and development processing unit 102, and these openings are connected with each other gas-tightly. Disposed adjacent to the opening 108 is the cassette 105a. By means of the conveying system 104, a workpiece can be conveyed along any one of the following conveying paths:

cassette 105a→exposure stage 103→cassette 105a
cassette 105a→exposure stage 103→cassette 105b
cassette 105b→exposure stage 103→cassette 105b
cassette 105b→exposure stage 103→cassette 105a With this arrangement, it becomes possible to meet the layout in the factory flexibly, as will be described later.

Denoted at 109 is a conveyance arm for transferring a workpiece between the exposure apparatus 101 and the coating and development unit 102. It is provided within the coating and development processing unit 102. Denoted at 110 (110a and 110b) are cassettes disposed within the coating and development processing unit 102, each being able to accommodate therein a plurality of workpieces. Denoted at 111 (111a and 111b) are cassette tables on which corresponding cassettes are placed. Denoted at 112 is a sensor for discriminating whether a cassette 105 is a common cassette (normal cassette) or a through cassette (cassette corresponding to a common cassette without stoppers), to be described later. Denoted at 113 are stoppers mounted in the innermost portion of the cassette. Denoted at 114 is one step (stair) within the cassette 105a to which a workpiece having a resist coated by the coating and development apparatus is to be inserted. Denoted at 115 is one step (stair) within the cassette 105a to which a workpiece having been exposed by the exposure apparatus is to be inserted. Denoted at 116 (116a, 116b and 116c) are workpieces.

Figure 6:
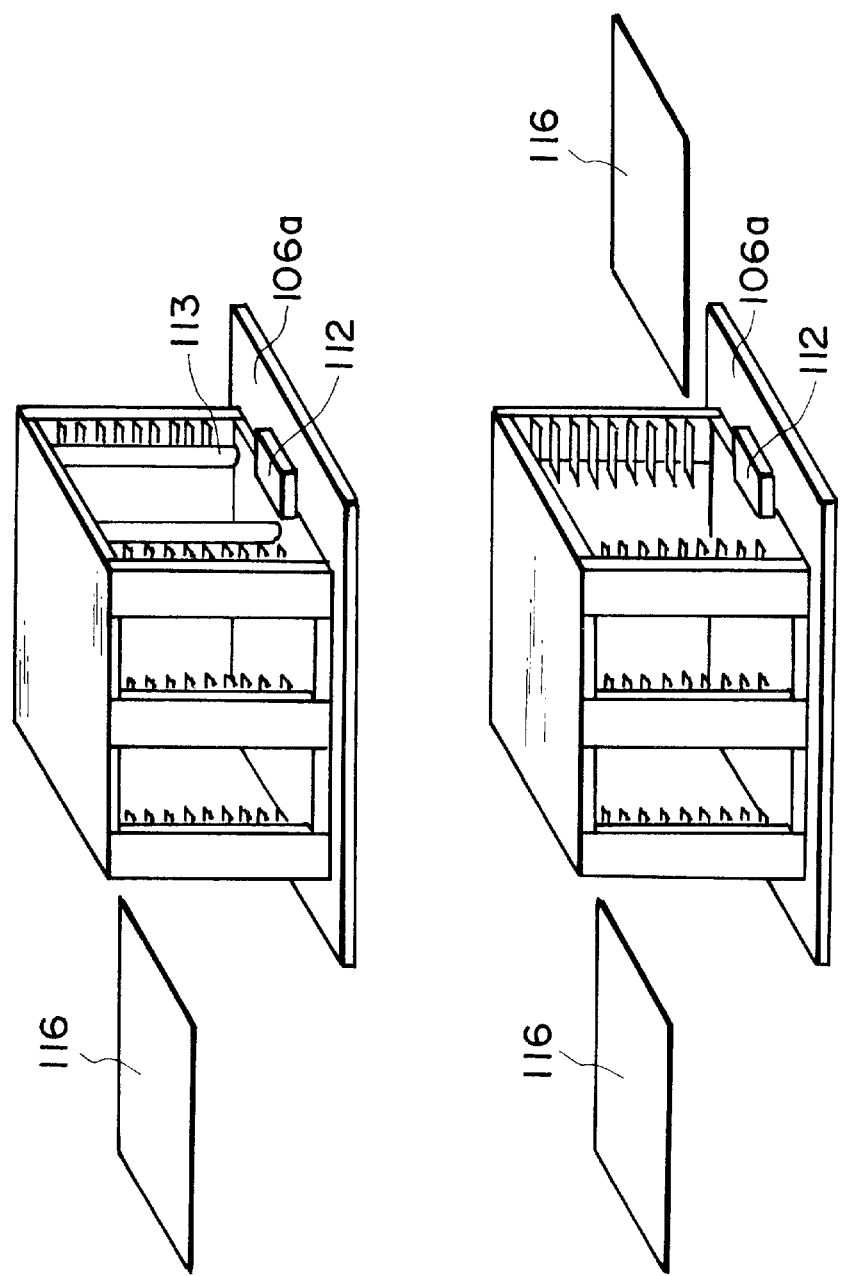
FIGS. 6A and 6B are schematic views for explaining a common cassette and a through cassette.

Each of the cassettes 105c, 110a and 110b has stoppers 113 in the innermost portion thereof, and thus each is a common cassette in which a workpiece can be inserted into and taken out of the cassette only through one side (front face) thereof. On the other hand, the cassette 105a is a through cassette in which stoppers of a common cassette are removed such that a workpiece can be inserted into and taken out of the cassette through any of the front and rear faces. FIGS. 6A and 6B illustrate a common cassette and a through cassette in detail. FIG. 6A shows the structure of a common cassette wherein stoppers 13 are provided at the rear face. FIG. 6B shows a through cassette wherein stoppers are removed. These cassettes have a difference only in the point of presence/absence of stoppers. They have the same shape and are made of the same material. Thus, the cassette table 106a can be mounted to any one of these cassettes, as required. These cassettes have to be cleaned periodically but, because of the same shape and material, there is no need for special modification to the cleaning process. In order to prevent erroneous mounting of inappropriate cassette on the cassette table, the sensor 112 provided on the cassette table is used to discriminate the type of the cassette. If an inappropriate cassette is mounted, an alarm is produced.

In the in-line processing system of FIG. 5, plural workpieces of unit lot are accommodated in each of the cassettes 110a and 110b. The workpieces accommodated in the cassette 110a are taken out one by one, and resist coating process is performed to them by the coating portion of the coating and development apparatus. The thus coating-processed workpiece 116b is conveyed by the conveyance arm 109 of the coating and development processing unit 102 and, after passing through the opening 108 of the exposure processing unit 107, it is inserted on to one (114) of the steps (stairs) within the cassette 105a disposed in the exposure processing unit 107, through the front (forward) face of the cassette. On the other hand, by means of the conveying system 104 of the exposure apparatus, the thus inserted workpiece is taken out of the through cassette 105a, from the rear (innermost) face of it, and the workpiece is conveyed on to the exposure stage 103. The workpiece as processed (exposed) by the exposure apparatus is then collected again by the conveying system 104, and it is inserted on to one step 115 (different from the step 114) within the through cassette 105a, through the rear face thereof. As for these steps 114 and 115, any of vacant steps may be used. A workpiece having undergone the exposure process is taken out of the through cassette 105a by the conveyance arm 109, through the front face of the cassette, and it is conveyed to the development portion of the coating and development apparatus. Then, after the development process, the workpiece is stored into the cassette 110a or 110b. The sequential operations described above are performed to every workpiece, and the coating process, exposure process and development process are carried out. A series of automatic processes such as described above is called an "in-line processing".

The through cassette 105a serves as a buffer, and any difference in throughput between the coating and development processing and the exposure processing can be absorbed thereby. Also, the other cassettes 105b and 105c within the exposure processing unit can be used for emergency supply purpose. An example is that: if the coating and development apparatus is out of order and the in-line processing is disabled, workpieces having been coating-processed by a separate coating and development apparatus may be put into the common cassette 105b or 105c; and the operator may put the cassette on the cassette table 106b or 106c and the exposure process may be executed singly. The procedure described above wherein an exposure apparatus is used singly, independently of a coating and development apparatus, is called an "off-line processing".

As an alternative, the cassettes 105a, 105b and 105c may be used as follows. If a workpiece to be processed by the exposure apparatus 101 is defective (for example, an alignment mark has not been resolved), the exposure process can not be started and the in-line processing of the workpiece becomes stagnant. In such case, the exposure apparatus produces an alarm sound or light to the operator, and the operation will be continued on the basis of judgment of the operator (as an example, the alignment operation will be made through naked-eye observation by the operator, or the operator will determine whether the workpiece-should be exposed or unloaded without exposure). However, in practical production lines wherein the number of operators is decreased, each operator has to take charge of an increased number of apparatuses. It is therefore desirable that troubles are dealt with automatically, as much as possible. In consideration thereof, if the system detects a defective workpiece to which the exposure process should not be performed, the conveying system 104 collects such workpiece and then stores it into the cassette 105b or 105c, temporarily. The cassette for temporary storage of defective workpiece will be called an "error cassette". Then, the exposure apparatus continues processing of a subsequent workpiece, to minimize stagnation of a series of coating process, exposure process and development process. At the moment whereat the processing of one lot is completed, if in that lot there is a workpiece temporarily retracted, such workpiece is fed from the cassette 105b or 105c on to the exposure stage 103 and the exposure process is performed thereto. If the exposure process is finished without problem, the workpiece is then treated as a good one and the development process is carried out thereto. If it is discriminated again as defective, the exposure apparatus 101 at last produces an alarm sound or light to induce intervention of the operator. In that occasion, the exposure process may be continued on the basis of judgment by the operator.

However, if plural workpieces have been stored in the cassette 105b or 105c, there is a high possibility that retry of exposure process to these workpieces would end in failure. Thus, the operator may focus on the operation of this exposure apparatus.

Using the cassette 105b or 105c as an error cassette for temporal storage of a defective workpiece or workpieces as described above, will reduce the load to the operator and will save the number of operators required.

Figure 7:
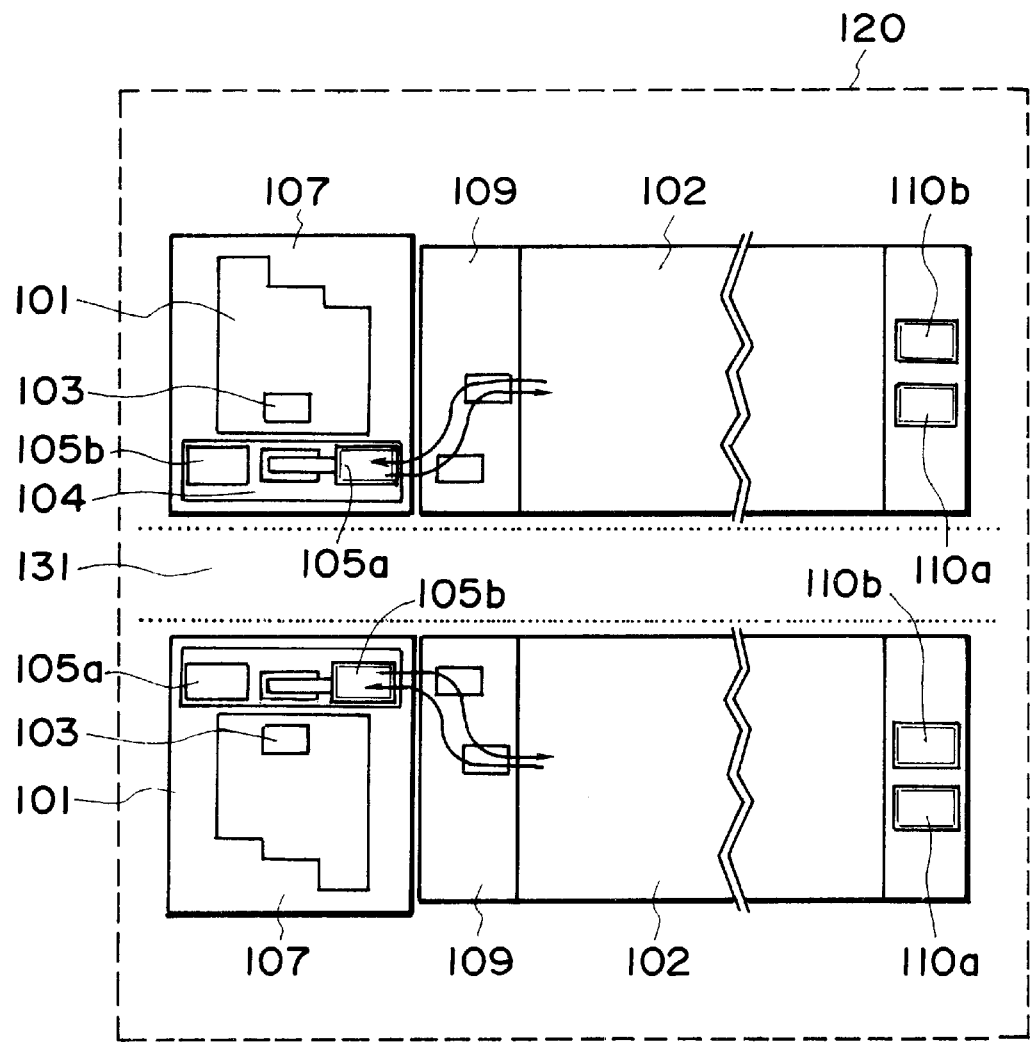
FIG. 7 is a schematic view for explaining a preferable example of layout of a production line in a factory.
Figure 8:
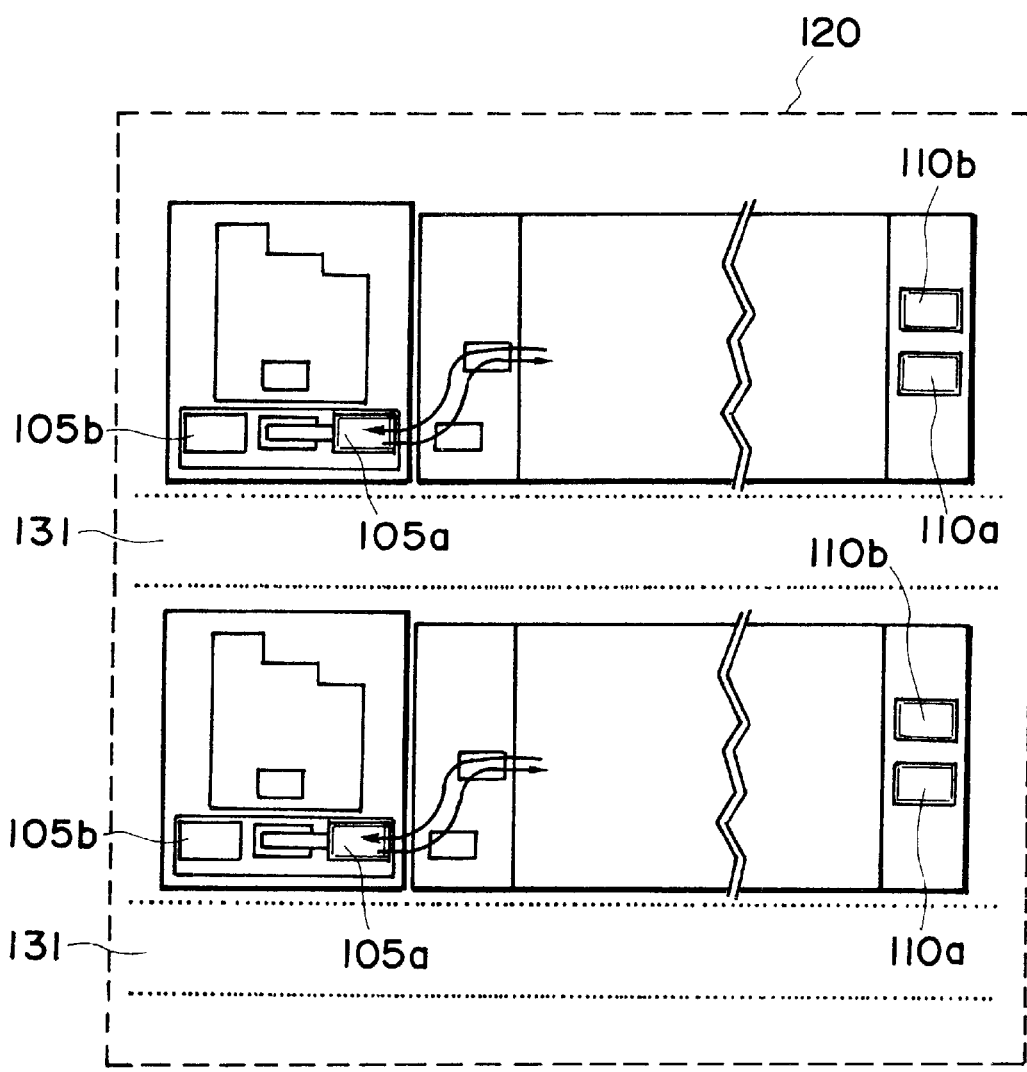
FIG. 8 is a schematic view of a layout to be compared with the example of FIG. 7.

FIGS. 7 and 8 are plan views each showing an example of layout of placement of an exposure apparatus and a coating and development apparatus in production line of a factory. In these examples, there are two lines placed in a clean room, each line comprising a combination of an exposure apparatus 101 and a coating and development apparatus 102. This embodiment uses the layout of FIG. 7, and the exposure apparatus of one of the two lines is disposed with rotation by 180 deg. such that the exposure apparatuses of the two lines are opposed to each other. Here, cassettes 105a and 105b each comprises a through cassette. FIG. 8 shows a layout to be compared with that of FIG. 7. In this example, the exposure apparatuses of the two lines are oriented in the same direction. For operation or maintenance of an apparatus, the operator will accesses to a particular face (which is called here a "front face") of the apparatus, which is usually determined and unchanged. Thus, when the two exposure apparatus are disposed opposed to each other as shown in FIG. 7, the front faces of the exposure apparatuses are opposed to each other and there is defined a common work space 131 for the operator's operation or maintenance. With the example of FIG. 8, on the other hand, it is necessary to prepare work spaces 131 for the exposure apparatuses, respectively. Thus, the space efficiency is better in the FIG. 7 layout. This leads to superiority of the FIG. 7 layout in the point of the cost for maintaining the environment such as temperature, humidity and cleanness within the clean room 120.

Although in this embodiment the conveyance arm is provided within the coating and development processing unit, it may be provided in the exposure processing unit. An alternative structure may be that neither the exposure processing unit nor the coating and development processing unit has a conveyance arm, but a conveyance arm which can access to each of the exposure processing unit and the coating and development processing unit is provided between these units.

The concept described above is applicable not only to the connection between an exposure apparatus and a coating and development apparatus as described but also to an in-line processing system having successive processes such as a combination of a development apparatus and an etching apparatus, a combination of an etching apparatus and an usher, or a combination of an usher and a film forming apparatus, for example.

Embodiment 3

An in-line processing system according to a third embodiment will now be described. While in the second embodiment a buffer cassette or an error cassette for temporary storage of workpieces is provided at the exposure processing unit side, in this embodiment it is provided at the coating and development processing unit side. Also, the conveyance arm provided at the coating and development apparatus side is arranged so that a workpiece can be supplied directly to the stage of the exposure apparatus. Here, description will be made of an example wherein a workpiece is a glass substrate for liquid crystal panel. However, it may be a semiconductor substrate for integrated circuit.

Figure 9:
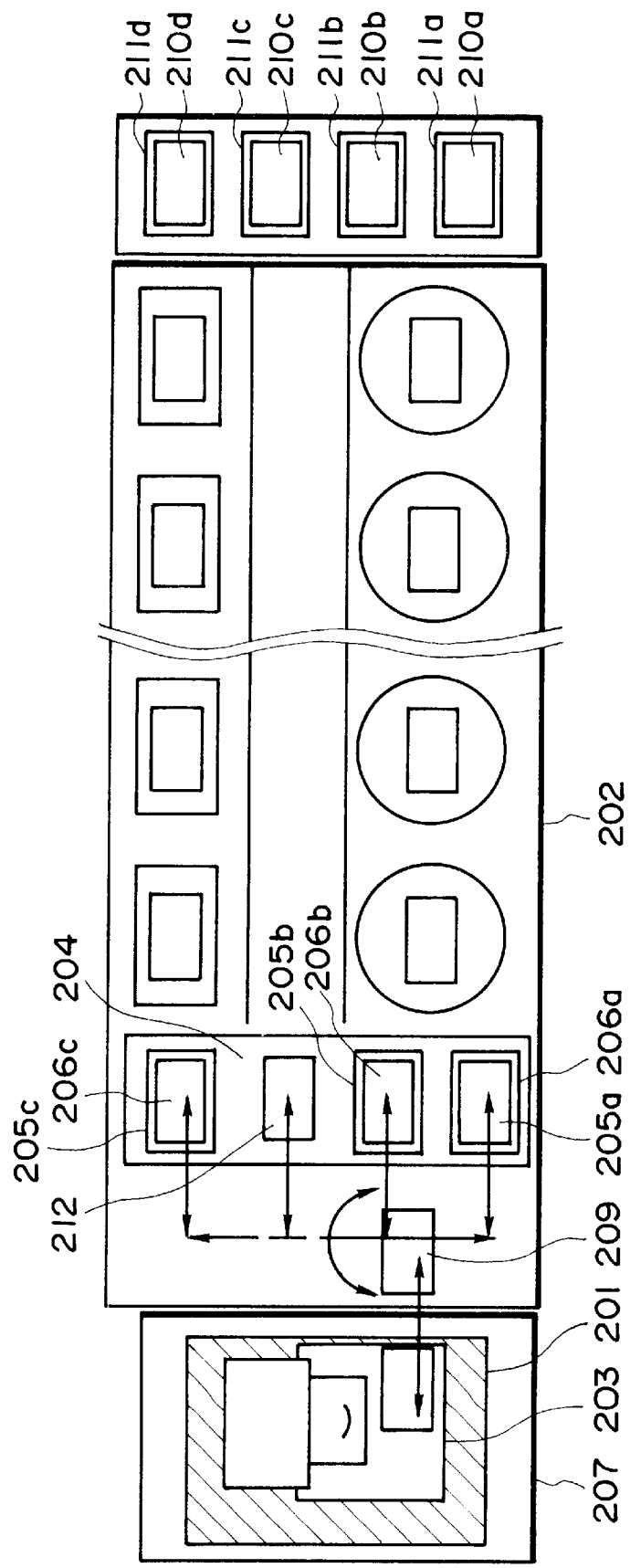
FIG. 9 is a schematic view of general structure of an in-line processing system according to a third embodiment of the present invention.
Figure 10:
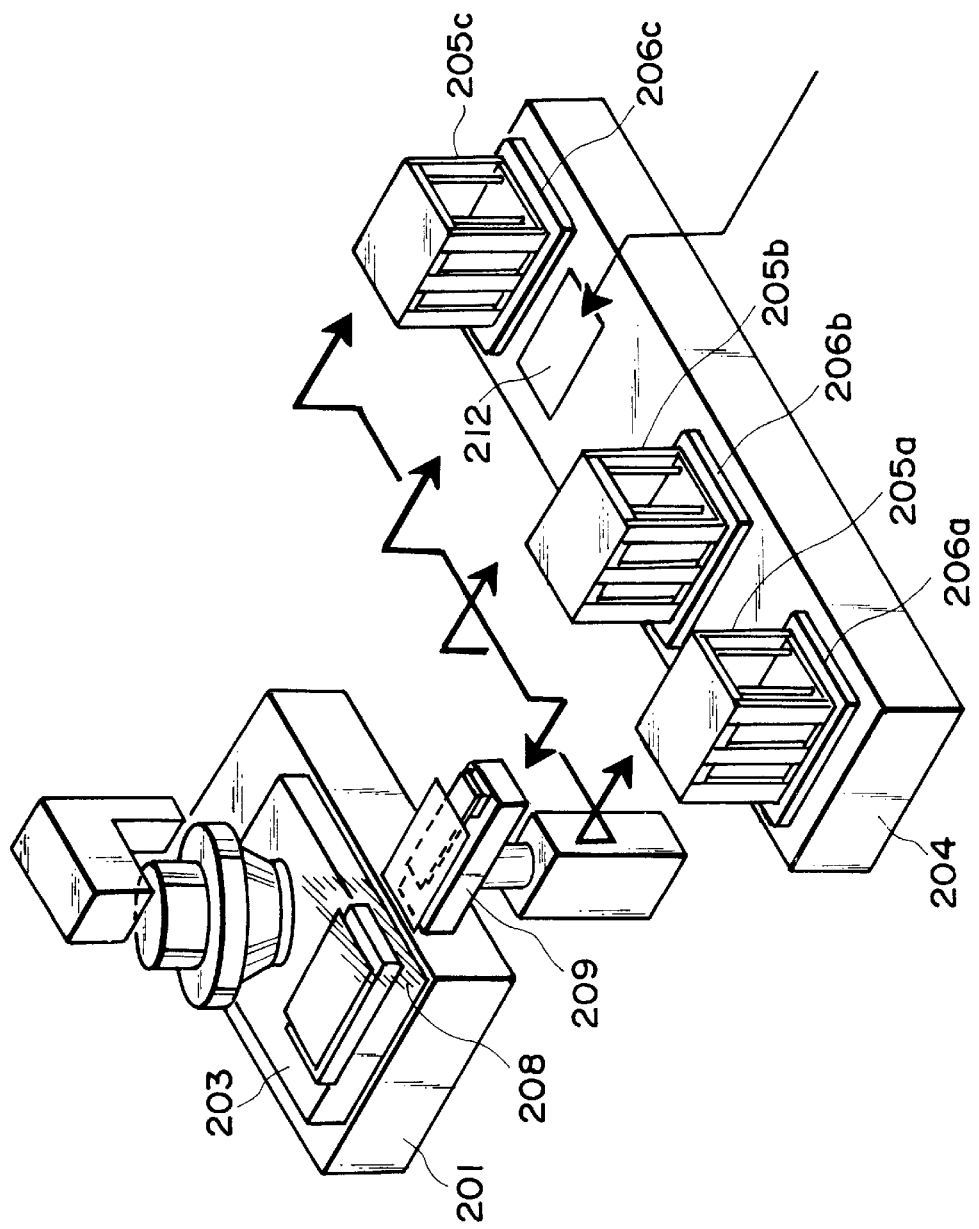
FIG. 10 is a fragmentary perspective view of a portion of the processing system of FIG. 9.

FIG. 9 is a plan view of general structure of the system, and FIG. 10 is a fragmentary perspective view of it. Workpieces accommodated in each of cassettes 210a, 210b, 210c and 210d are taken out one by one, and, after resist coating process within a coating and development unit 202, each workpiece is moved on to a substrate transfer table 204. The workpiece 212 on the transfer table 204 is picked up by a conveyance arm 209 provided in the coating and development unit 2, and it is conveyed through an introduction opening 208 and directly on to an exposure stage 203 of the exposure apparatus 201. The workpiece having undergone the exposure process within the exposure apparatus 201 is conveyed again by the conveyance arm 209 back to the transfer table 204 through the opening 208. Then, the workpiece is conveyed from the table 204 into the development portion and, after completion of the development process, it is collected into the cassette 210.

The conveyance arm 209 provided in the coating and development unit is able to directly access to the inside of the exposure unit. By means of the conveyance arm, a workpiece can be conveyed along any of the following conveyance paths:

table 204→exposure stage 203→table 204
table 204→exposure stage 203→cassette 205
cassette 205→exposure stage 203→table 204
cassette 205→exposure stage 203→cassette 205

In the processing system of this embodiment, the cassettes 205a, 205b and 205c each serves as an emergency buffer ("buffer cassette"). This avoids stoppage of the line as a whole, even if any of the coating apparatus, exposure apparatus and development apparatus becomes out of order, and it enables offline processing wherein an operable apparatus or apparatuses are operated singly.

If, for example, the flow of workpieces becomes stagnant at the exposure apparatus, the conveyance arm may put a workpiece or workpieces, supplied from the coating process portion of the coating and development apparatus, into a buffer cassette. When the exposure apparatus is retrieved, those workpieces subsequently supplied from the coating process portion and those workpieces within the buffer cassette may be processed sequentially. This avoids stoppage of the line.

If the flow of workpieces becomes stagnant at the developing process portion of the coating and development apparatus, the conveyance arm may put workpieces, as processed by the exposure apparatus, into a buffer cassette. When the development apparatus is retrieved, those workpieces subsequently supplied by the exposure apparatus and those workpieces in the buffer cassette may be processed sequentially. This avoids stoppage of the line.

One of the buffer cassettes may be used as an error cassette, as described with reference to the preceding embodiment. Since the operator may focus on processing of those workpieces in the error cassette, the number of operators required may be saved.

Although in this embodiment the conveyance arm is provided within the coating and development processing unit, it may be provided in the exposure processing unit. An alternative structure may be that neither the exposure processing unit nor the coating and development processing unit has a conveyance arm, but a conveyance arm which can access to each of the exposure processing unit and the coating and development processing unit is provided between these units.

The concept described above is applicable not only to the connection between an exposure apparatus and a coating and development apparatus as described but also to an in-line processing system having successive processes such as a combination of a development apparatus and an etching apparatus, a combination of an etching apparatus and an usher, or a combination of an usher and a film forming apparatus, for example.

Embodiment 4

Next, an embodiment of device manufacturing method which uses any one of in-line processing systems such as described above, will be explained.

Figure 11:
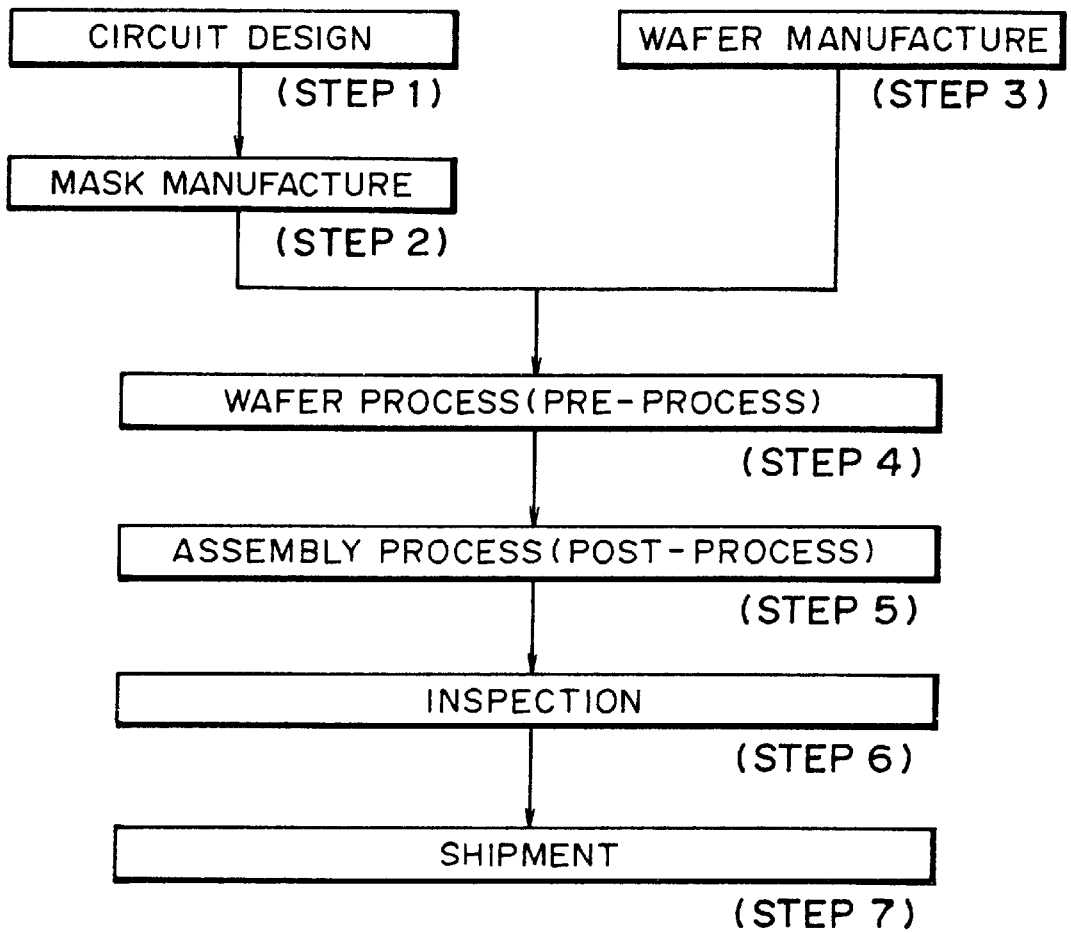
FIG. 11 is a flow chart of device manufacturing processes.

FIG. 11 is a flow chart of procedure for manufacture of microdevices such as semiconductor chips (e.g. ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes assembling (dicing and bonding) process and packaging (chip sealing) process. Step 6 is an inspection step wherein operation check, durability check and so on for the semiconductor devices provided by step 5, are carried out. With these processes, semiconductor devices are completed and they are shipped (step 7).

Figure 12:
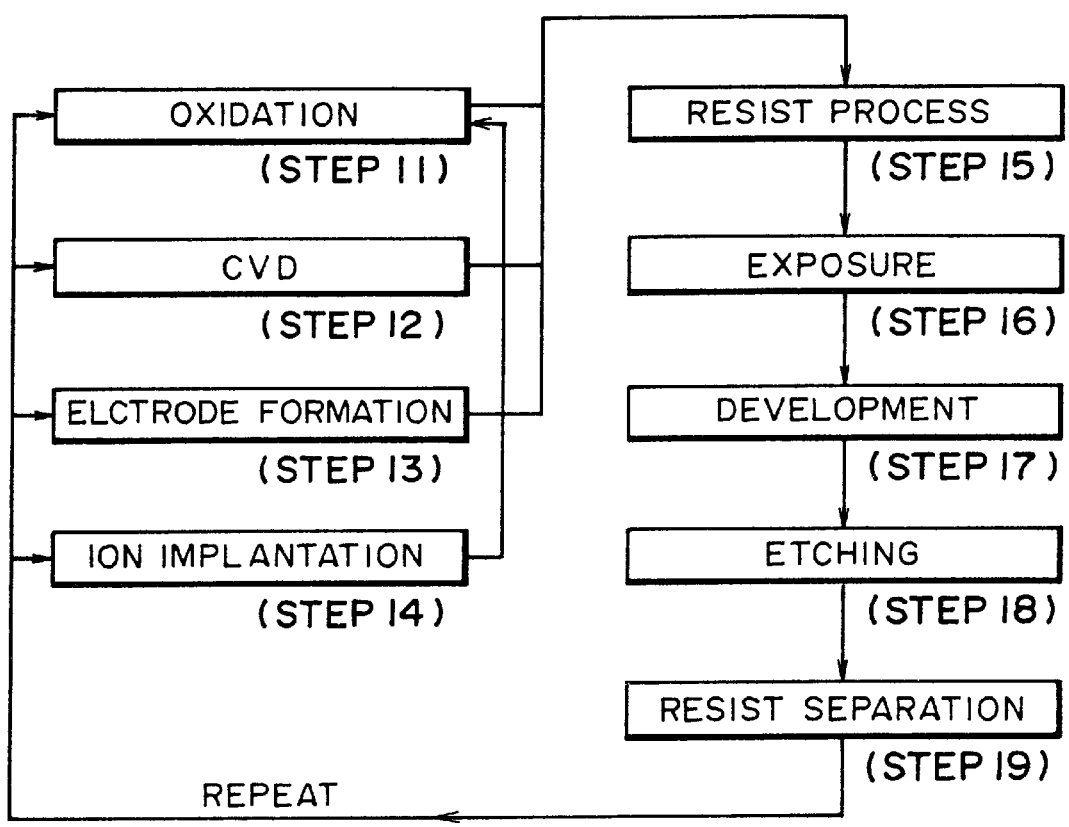
FIG. 12 is a flow chart for explaining details of a wafer process.

FIG. 12 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

The device manufacturing method of this embodiment enables manufacture of large-size devices with lower cost.

While the invention has been described with reference to the structures disclosed herein, it is not confined to the details set forth and this application is intended to cover such modifications or changes as may come within the purposes of the improvements or the scope of the following claims.

What is claimed is:

1. An in-line processing system usable with plural workpieces, comprising:
   a first processing unit for performing an exposure process to a workpiece;
   a second processing unit for performing a second process, different from the exposure process, to the workpiece;
   a conveying arm mechanism for conveying the workpiece between said first and second processing units and being accessible to each of the first and second processing units; and a storing mechanism for temporarily accommodating those workpieces which are defective with respect to the exposure process to be performed.

2. An in-line processing system, comprising:

a first line; and a second line;

wherein each of said first and second lines has a first processing unit having an exposure apparatus, for performing an exposure process to a workpiece, and a second processing unit connected to said first processing unit and for performing a second process, different from the exposure process, to the workpiece;

wherein said first and second lines are arranged so that front faces of the exposure apparatuses of said first processing units of said first and second lines are opposed to each other, and so that a work space for an operator is defined between the opposed exposure apparatuses.

3. A system according to any one of claims 1 and 2, wherein said second processing system includes at least one of a resist coating apparatus and a developing apparatus.

4. A system according to any one of claims 1 and 2, wherein both of said first and second units are disposed in a clean room.

5. A method of manufacturing a device comprising the steps of:

performing an exposure process to a workpiece in a first processing unit;

performing a second process, different from the exposure process, to the workpiece in a second processing unit;

conveying the workpiece between said first and second processing units by a conveying arm mechanism accessible to each of the first and second processing units; and temporarily accommodating those workpieces which are defective with respect to the exposure process to be performed by a storing mechanism.

6. A method of manufacturing a device in an in-line system having first and second lines comprising the steps of:

performing an exposure process to a workpiece in an exposure apparatus of a first processing unit in each of the first and second lines;

performing a second process different than the exposure process to the workpiece in a second processing unit connected to the first processing unit in each of the first and second lines; and arranging the first and second lines so that a front face of the exposure apparatuses of the first processing units of the first and second lines are opposed to each other, and so that a work space for an operator is defined between the opposed exposure apparatuses.

* * * * *

UNITED STATES PATENT AND TRADEMARK OFFICE
CERTIFICATE OF CORRECTION

PATENT NO. : 5,993,081

DATED : November 30, 1999

INVENTORS : HIROYUKI ITOH, ET AL.

It is certified that error appears in the above-identified patent and that said Letters Patent is hereby corrected as shown below:

IN THE DRAWINGS:
SHEET 11, FIG. 12, in step 13, "ELCTRODE" should read --ELECTRODE--.

COLUMN 2:
Line 49, "includes" should read --include--.

COLUMN 3:
Line 61, "is" (second occurrence) should be deleted.

COLUMN 4:
Line 55, "Simultaneously" should read --Simultaneously,--.

COLUMN 7:
Line 12, "into" should read --in--.

UNITED STATES PATENT AND TRADEMARK OFFICE
CERTIFICATE OF CORRECTION

PATENT NO. : 5,993,081

DATED : November 30, 1999

INVENTORS : HIROYUKI ITOH, ET AL.

It is certified that error appears in the above-identified patent and that said Letters Patent is hereby corrected as shown below:

<u>COLUMN 8</u>:
Line 23, "accesses" should read --access--.

<u>COLUMN 9</u>:
Line 17, "into" should read --in--.

Signed and Sealed this

Thirteenth Day of February, 2001

*Attest:*

NICHOLAS P. GODICI

*Attesting Officer*   Acting Director of the United States Patent and Trademark Office